United States Patent
Yang

(10) Patent No.: US 11,936,326 B2
(45) Date of Patent: Mar. 19, 2024

(54) MOTOR CONTROLLER

(71) Applicant: Global Mixed-mode Technology Inc., Hsin-Chu (TW)

(72) Inventor: Chia-Tai Yang, Hsinchu County (TW)

(73) Assignee: Global Mixed-mode Technology Inc., Hsin-Chu (TW)

( * ) Notice: Subject to any disclaimer, the term of this patent is extended or adjusted under 35 U.S.C. 154(b) by 184 days.

(21) Appl. No.: 17/394,418

(22) Filed: Aug. 5, 2021

(65) Prior Publication Data

US 2023/0040880 A1 Feb. 9, 2023

(51) Int. Cl.
 *H02P 7/29* (2016.01)
 *H03K 4/08* (2006.01)

(52) U.S. Cl.
 CPC . *H02P 7/29* (2013.01); *H03K 4/08* (2013.01)

(58) Field of Classification Search
 CPC ....................................................... H03K 4/08
 USPC ........................................................ 318/503
 See application file for complete search history.

(56) References Cited

U.S. PATENT DOCUMENTS

| | | | | | |
|---|---|---|---|---|---|
| 4,138,723 | A | * | 2/1979 | Nehmer | H02P 23/0077 |
| | | | | | 700/304 |
| 2006/0104343 | A1 | * | 5/2006 | Agarwal | H03K 7/08 |
| | | | | | 375/238 |
| 2008/0066700 | A1 | * | 3/2008 | Mashiki | F01L 1/022 |
| | | | | | 123/90.11 |
| 2013/0069576 | A1 | | 3/2013 | Lee | |
| 2013/0069702 | A1 | * | 3/2013 | Ogawa | H03K 7/08 |
| | | | | | 327/175 |
| 2013/0221886 | A1 | * | 8/2013 | Matsumoto | B60W 10/20 |
| | | | | | 318/400.17 |
| 2014/0092653 | A1 | * | 4/2014 | Suzuki | H03K 17/7955 |
| | | | | | 363/124 |
| 2014/0366286 | A1 | * | 12/2014 | Zheng | A47L 11/4008 |
| | | | | | 15/3 |
| 2016/0241177 | A1 | * | 8/2016 | Kurosawa | H02P 29/50 |
| 2016/0380565 | A1 | * | 12/2016 | Chen | H02P 6/14 |
| | | | | | 318/504 |

(Continued)

FOREIGN PATENT DOCUMENTS

| TW | 200402185 | | 2/2004 |
|---|---|---|---|
| TW | 201902107 | A | 1/2019 |
| TW | 201935841 | A | 9/2019 |

OTHER PUBLICATIONS

JP 2006304417 A "Inverter Controller" Kitaguchi Date Published Nov. 2, 2006 Noya Joji (Year: 2005).*

(Continued)

*Primary Examiner* — Jorge L Carrasquillo
(74) *Attorney, Agent, or Firm* — Winston Hsu

(57) ABSTRACT

A motor controller comprises a switch circuit, a control unit, and a duty cycle processing unit. The switch circuit is coupled to a motor for driving the motor. The control unit is configured to generate a plurality of control signals to control the switch circuit. The duty cycle processing unit receives a first pulse width modulation signal, where the first pulse width modulation has a first duty cycle. The duty cycle processing unit is configured to judge if the first duty cycle is equal to 0% or 100%. The duty cycle processing unit comprises a duty cycle computing unit, where the duty cycle computing unit is configured to capture the first duty cycle.

44 Claims, 5 Drawing Sheets

(56) References Cited

U.S. PATENT DOCUMENTS

2019/0260316 A1\* 8/2019 Noie .......................... H02P 7/04

OTHER PUBLICATIONS

JP 2019146293 A "Fan Motor Drive Circuit, Driving Method, Cooling Device Employing the Same and Electronic Apparatus" Date Published Aug. 29, 2019 (Year: 2019).\*

Noya et al. (JP 2019146293 A) "Fan Motor Drive Circuit, Driving Method, Cooling Device Employing the Same and Electronic Apparatus" Date Published: Aug. 29, 2019 (Year: 2019).\*

\* cited by examiner

MOTOR CONTROLLER

BACKGROUND OF THE INVENTION

1. Field of the Invention

The present invention relates to a motor controller, and more particularly, to a motor controller which may be applied to a fan motor system.

2. Description of the Prior Art

Conventionally, the motor controller utilizes the duty cycle of the input pulse width modulation signal to control the speed of the motor. The early method uses the input pulse width modulation signal directly for driving the motor. That is to say, the output duty cycle for driving the motor is equal to the duty cycle of the input pulse width modulation signal. However, when the motor controller utilizes the input pulse width modulation signal directly for entering a soft switching driving mode, the frequency of the output pulse width modulation signal after modulation may be in the range of the audio frequency, thereby generating noise. Furthermore, when the motor controller adopts the early method to execute the speed open-loop operation, if the power supply voltage or the temperature varies, the speed of the motor varies accordingly. Thus, a new technology is needed to solve the above problems.

SUMMARY OF THE INVENTION

According to the present invention, a motor controller which may be applied to a fan motor system is provided. The motor controller comprises a switch circuit, a control unit, a pulse width modulation processing unit, a duty cycle processing unit, and a soft switching processing unit. The switch circuit is coupled to a motor for driving the motor. The control unit is configured to generate a plurality of control signals to control the switch circuit. The duty cycle processing unit receives a first pulse width modulation signal, so as to generate a first signal to the pulse width modulation processing unit. The soft switching processing unit generates a second signal to the pulse width modulation processing unit, so as to enable that the motor controller is in a soft switching driving mode. The pulse width modulation processing unit is configured to generate a second pulse width modulation signal to the control unit based on the first signal and the second signal.

The first pulse width modulation signal has an ON time, an OFF time, a period, and a first duty cycle, where the first duty cycle is equal to (ON time/period)×100%. The duty cycle processing unit comprises a duty cycle computing unit, where the duty cycle computing unit comprises an ON time computing unit, an OFF time computing unit, a period computing unit, a charging unit, a discharging unit, and a memory unit. The duty cycle computing unit is configured to capture the first duty cycle. According to one embodiment of the present invention, the duty cycle processing unit may be configured to judge if the first duty cycle is equal to 0% or 100%. For example, when the time that the first pulse width modulation signal remains at a low level is greater than a first predetermined time, the duty cycle computing unit may judge that the first duty cycle is equal to 0%. When the time that the first pulse width modulation signal remains at a high level is greater than a second predetermined time, the duty cycle computing unit may judge that the first duty cycle is equal to 100%. When the time that the first pulse width modulation signal remains at a level is greater than a third predetermined time, the duty cycle computing unit may judge that the first duty cycle is equal to 0% or 100%. If the level is the low level, the first duty cycle is equal to 0%. If the level is the high level, the first duty cycle is equal to 100%. The duty cycle computing unit may further comprise a specific application computing unit to judge if the first duty cycle is equal to 0% or 100%. Moreover, the charging unit or the discharging unit may be configured to judge if the first duty cycle is equal to 0% or 100% as well.

The pulse width modulation processing unit comprises a multiplication operation unit, a comparing unit, and a triangular wave generating unit. In order to avoid noise when switching phases, the soft switching processing unit generates a second duty cycle. Then the pulse width modulation processing unit enables that the first duty cycle is multiplied by the second duty cycle for generating a modulated duty cycle. At last the pulse width modulation processing unit generates the second pulse width modulation signal to the control unit by comparing the modulated duty cycle with a comparing value. That is to say, the multiplication operation unit may generate a third signal to the comparing unit based on the first signal and the second signal, where the first signal has the first duty cycle, the second signal has the second duty cycle, and the third signal has the modulated duty cycle. The multiplication operation unit may perform a multiplication operation by utilizing a multiplier or a plurality of adders. The triangular wave generating unit is configured to generate a fourth signal to the comparing unit, where the fourth signal has the comparing value. The comparing unit may be a digital comparator. The comparing unit receives the third signal and the fourth signal, so as to compare the third signal with the fourth signal for generating the second pulse width modulation signal to the control unit. The fourth signal may be a signal having a fixed frequency, thereby enabling that the second pulse width modulation signal is also a signal having a fixed frequency. For example, when the fourth signal is greater than the third signal, the second pulse width modulation signal may be at the low level. When the fourth signal is less than or equal to the third signal, the second pulse width modulation signal may be at the high level. The soft switching processing unit may enable that the second duty cycle gradually decreases or increases with time by adjusting the second duty cycle. That is, both the modulated duty cycle and the duty cycle of the second pulse width modulation signal may gradually change when switching phases, such that a phase current gradually changes when switching phases, thereby avoiding noise. Thus, when the motor controller is in the soft switching driving mode, the motor controller may achieve a current wave shaping function when switching phases and avoid generating an audio frequency signal. Moreover, the motor controller may utilize the first duty cycle to operate in a speed closed-loop mode. The motor controller may enable that the motor achieves a target speed by capturing the first duty cycle. When the power supply voltage or the temperature varies, the speed of the motor remains unchanged. The motor controller may enable that the motor rotates stably and the speed of the motor does not drift. Therefore, the motor controller is capable of overcoming the problems encountered by the early method.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The above-mentioned and other objects, features, and advantages of the present invention will become apparent with reference to the following descriptions and accompanying drawings, wherein.

DETAILED DESCRIPTION

Preferred embodiments according to the present invention will be described in detail with reference to the drawings.

Figure 1:
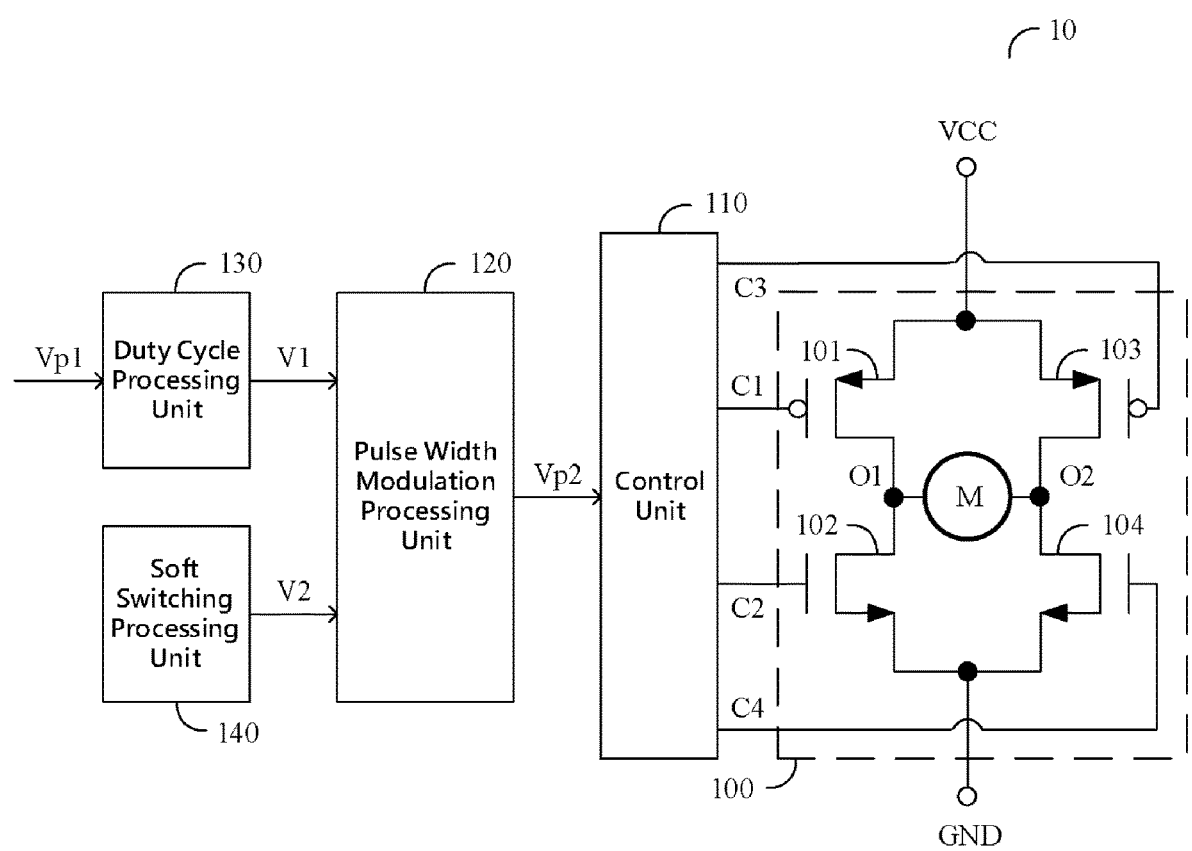
FIG. 1 is a schematic diagram showing a motor controller according to one embodiment of the present invention.

FIG. 1 is a schematic diagram showing a motor controller 10 according to one embodiment of the present invention. The motor controller 10 comprises a switch circuit 100, a control unit 110, a pulse width modulation processing unit 120, a duty cycle processing unit 130, and a soft switching processing unit 140. The switch circuit 100 includes a first transistor 101, a second transistor 102, a third transistor 103, and a fourth transistor 104 for driving a motor M. The first transistor 101 is coupled to a first terminal O1 and a terminal VCC while the second transistor 102 is coupled to the first terminal O1 and a terminal GND. The third transistor 103 is coupled to a second terminal O2 and the terminal VCC while the fourth transistor 104 is coupled to the second terminal O2 and the terminal GND. Each of the first transistor 101, the second transistor 102, the third transistor 103, and the fourth transistor 104 may be respectively a p-type MOSFET or an n-type MOSFET. As shown in FIG. 1, each of the first transistor 101 and the third transistor 103 may be a p-type MOSFET, while each of the second transistor 102 and the fourth transistor 104 may be an n-type MOSFET. The control unit 110 generates a first control signal C1, a second control signal C2, a third control signal C3, and a fourth control signal C4 so as to respectively control the ON/OFF states of the first transistor 101, the second transistor 102, the third transistor 103, and the fourth transistor 104. The duty cycle processing unit 130 receives a first pulse width modulation signal Vp1, so as to generate a first signal V1 to the pulse width modulation processing unit 120, where the first pulse width modulation signal Vp1 is an input pulse width modulation signal and the first signal V1 may be an M-shaped wave signal. The soft switching processing unit 140 generates a second signal V2 to the pulse width modulation processing unit 120, so as to enable that the motor controller 10 is in a soft switching driving mode. The pulse width modulation processing unit 120 is configured to generate a second pulse width modulation signal Vp2 to the control unit 110 based on the first signal V1 and the second signal V2, where the second pulse width modulation signal Vp2 is an output pulse width modulation signal. The motor controller 10 adjusts the speed of the motor M by the second pulse width modulation signal Vp2. Moreover, the motor controller 10 may be applied to a fan motor system.

Figure 2:
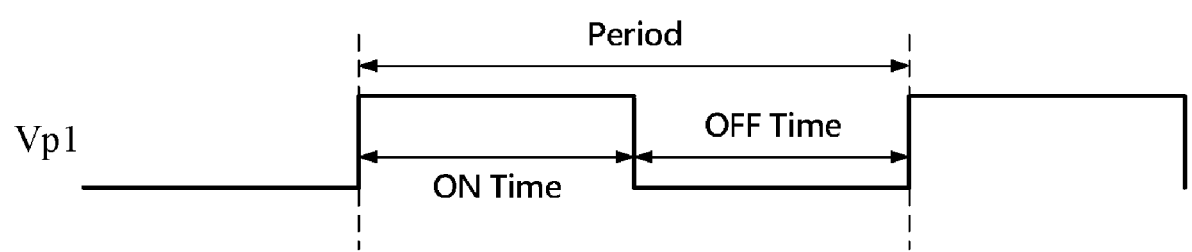
FIG. 2 is a timing chart according to one embodiment of the present invention.
Figure 3:
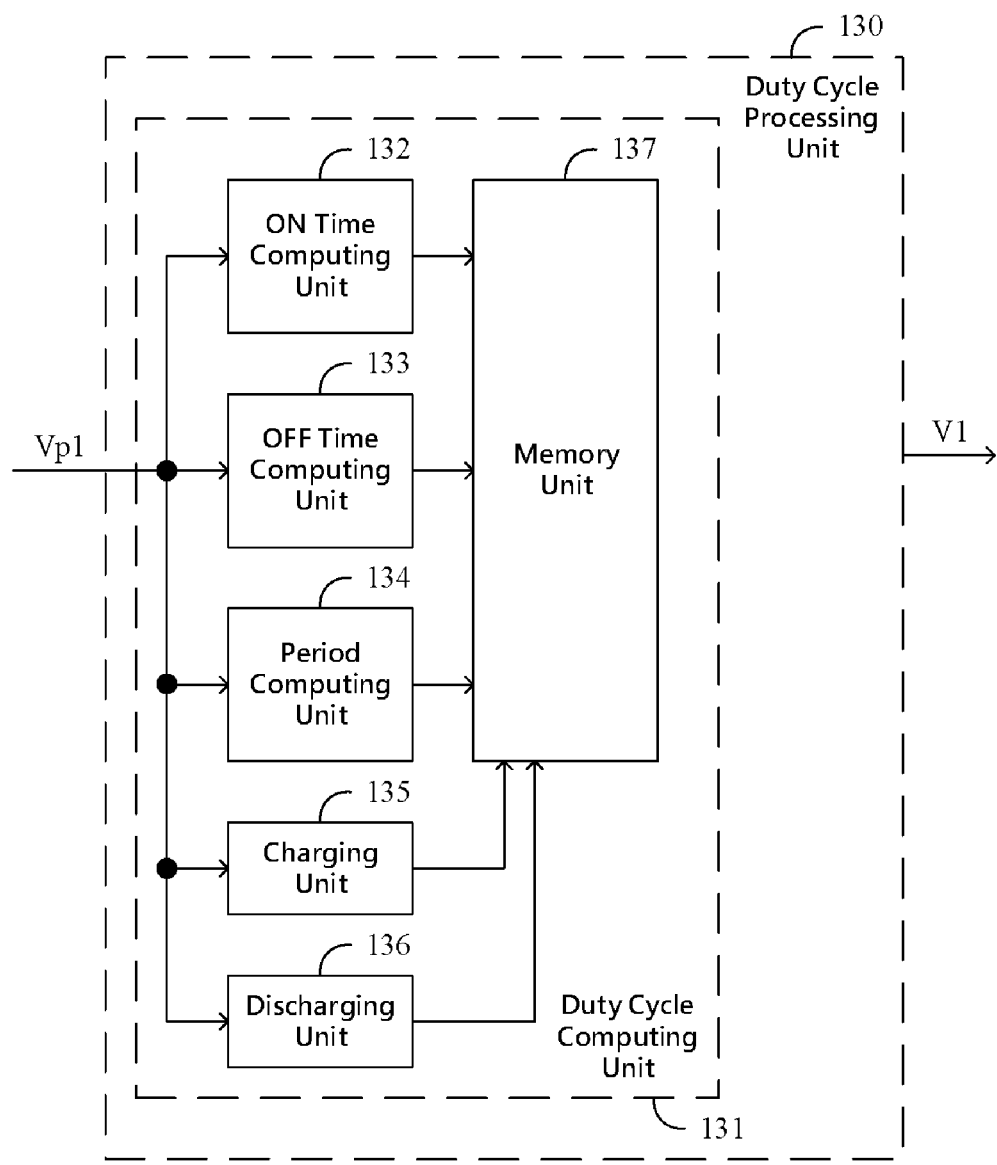
FIG. 3 is a schematic diagram showing a duty cycle processing unit according to one embodiment of the present invention.

FIG. 2 is a timing chart according to one embodiment of the present invention. The first pulse width modulation signal Vp1 has an ON time, an OFF time, a period, and a first duty cycle, where the first duty cycle is equal to (ON time/period)×100%. In order to overcome the problems encountered by the early method, the motor controller 10 needs to have a function of capturing the first duty cycle. FIG. 3 is a schematic diagram showing the duty cycle processing unit 130 according to one embodiment of the present invention. The duty cycle processing unit 130 comprises a duty cycle computing unit 131, where the duty cycle computing unit 131 comprises an ON time computing unit 132, an OFF time computing unit 133, a period computing unit 134, a charging unit 135, a discharging unit 136, and a memory unit 137. The duty cycle computing unit 131 is configured to capture the first duty cycle. The duty cycle computing unit 131 may be a part of a microcontroller, where the microcontroller is implemented in an integrated circuit chip. The ON time computing unit 132 receives the first pulse width modulation signal Vp1 for computing the ON time. The ON time computing unit 132 may compute the ON time by a plurality of flip-flops. The memory unit 137 is coupled to the ON time computing unit 132 for storing the ON time. The OFF time computing unit 133 receives the first pulse width modulation signal Vp1 for computing the OFF time. The OFF time computing unit 133 may compute the OFF time by a plurality of flip-flops. The memory unit 137 is coupled to the OFF time computing unit 133 for storing the OFF time. The period computing unit 134 receives the first pulse width modulation signal Vp1 for computing the period. The period computing unit 134 may compute the period by a plurality of flip-flops. The memory unit 137 is coupled to the period computing unit 134 for storing the period. Therefore, the duty cycle computing unit 131 may capture the first duty cycle based on the ON time, the OFF time, and the period which are stored in the memory unit 137. In order to simplify the duty cycle computing unit 131, the designer may select two of the ON time computing unit 132, the OFF time computing unit 133, and the period computing unit 134 for computing the first duty cycle. Furthermore, the first duty cycle may be represented by an N-bit value, where N is a positive integer and N is greater than 1. According to a preferred embodiment of the present invention, N may be equal to 8.

However, the above formula used for computing the first duty cycle is incapable of computing two extreme values 0% and 100% accurately. Thus, a particular method is needed to capture 0% and 100%. According to one embodiment of the present invention, the duty cycle processing unit 130 may be configured to judge if the first duty cycle is equal to 0% or 100%. For example, when the time that the first pulse width modulation signal Vp1 remains at a low level is greater than a first predetermined time, the duty cycle computing unit 131 may judge that the first duty cycle is equal to 0%. When the time that the first pulse width modulation signal Vp1 remains at a high level is greater than a second predetermined time, the duty cycle computing unit 131 may judge that the first duty cycle is equal to 100%. When the time that the first pulse width modulation signal Vp1 remains at a level is greater than a third predetermined time, the duty cycle computing unit 131 may judge that the first duty cycle is equal to 0% or 100%. If the level is the low level, the first duty cycle is equal to 0%. If the level is the high level, the first duty cycle is equal to 100%. Consequently, the OFF time computing unit 133 or the period computing unit 134 may be configured to judge if the first duty cycle is equal to 0%. The ON time computing unit 132 or the period computing unit 134 may be configured to judge if the first duty cycle is equal to 100%. The duty cycle computing unit 131 may further comprise a specific application computing unit to judge if the first duty cycle is equal to 0% or 100%. The specific application computing unit is configured to judge if the first duty cycle is equal to 0% or 100%. Moreover, the charging unit 135 or the discharging unit 136 may be configured to judge if the first duty cycle is equal to 0% or 100% as well. For example, the charging unit 135 may charge a device based on the first pulse width modulation signal Vp1, then the duty cycle computing unit 131 judges if the first duty cycle is equal to 0% or 100% based on a parameter value of the device. The discharging unit 136 may discharge a device based on the first pulse width modulation signal Vp1, then the duty cycle computing unit 131 judges if the first duty cycle is equal to 0% or 100% based on a parameter value of the device. That is, the duty cycle computing unit 131 may utilize a charging procedure to judge if the first duty cycle is equal to 0% or 100%. The duty cycle computing unit 131 may utilize a discharging procedure to judge if the first duty cycle is equal to 0% or 100%.

Figure 4:
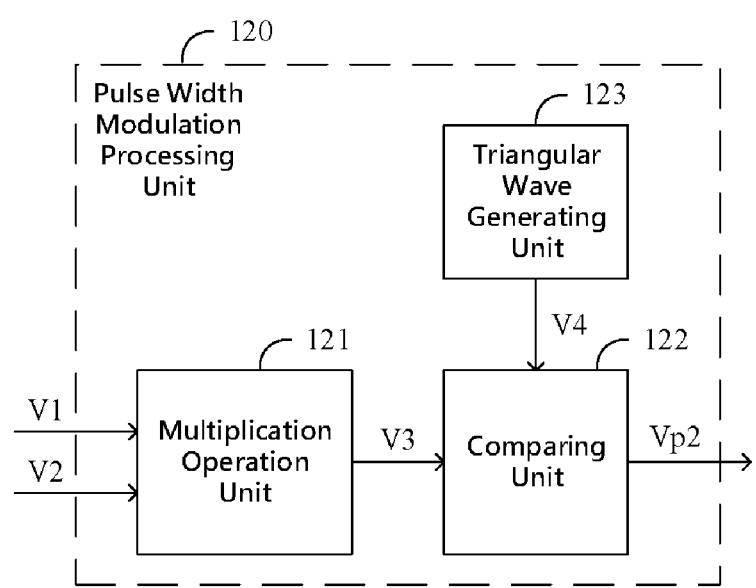
FIG. 4 is a schematic diagram showing a pulse width modulation processing unit according to one embodiment of the present invention.
Figure 5:
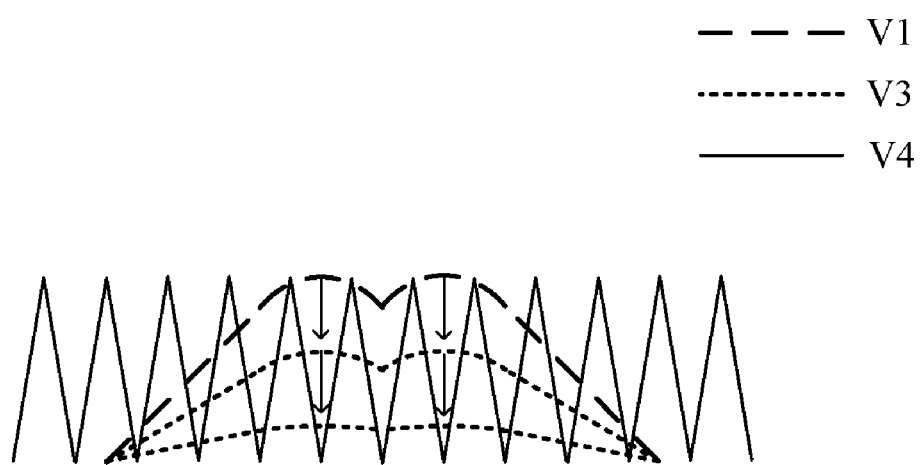
FIG. 5 is a waveform chart according to one embodiment of the present invention.

FIG. 4 is a schematic diagram showing the pulse width modulation processing unit 120 according to one embodiment of the present invention. The pulse width modulation processing unit 120 comprises a multiplication operation unit 121, a comparing unit 122, and a triangular wave generating unit 123. Please refer to FIG. 1 and FIG. 4 simultaneously. In order to avoid noise when switching phases, the soft switching processing unit 140 generates a second duty cycle, where the second duty cycle may be represented by the N-bit value. Then the pulse width modulation processing unit 120 enables that the first duty cycle is multiplied by the second duty cycle for generating a modulated duty cycle, where the modulated duty cycle may be represented by the N-bit value. At last the pulse width modulation processing unit 120 generates the second pulse width modulation signal Vp2 to the control unit 110 by comparing the modulated duty cycle with a comparing value, where the comparing value may be represented by the N-bit value. According to a preferred embodiment of the present invention, N may be equal to 8. That is to say, the multiplication operation unit 121 may generate a third signal V3 to the comparing unit 122 based on the first signal V1 and the second signal V2, where the first signal V1 has the first duty cycle, the second signal V2 has the second duty cycle, and the third signal V3 has the modulated duty cycle. The multiplication operation unit 121 may perform a multiplication operation by utilizing a multiplier or a plurality of adders. The triangular wave generating unit 123 is configured to generate a fourth signal V4 to the comparing unit 122, where the fourth signal V4 has the comparing value. The comparing unit 122 may be a digital comparator. The comparing unit 122 receives the third signal V3 and the fourth signal V4, so as to compare the third signal V3 with the fourth signal V4 for generating the second pulse width modulation signal Vp2 to the control unit 110. The fourth signal V4 may be a signal having a fixed frequency, thereby enabling that the second pulse width modulation signal Vp2 is also a signal having a fixed frequency. For example, when the fourth signal V4 is greater than the third signal V3, the second pulse width modulation signal Vp2 may be at the low level. When the fourth signal V4 is less than or equal to the third signal V3, the second pulse width modulation signal Vp2 may be at the high level. FIG. 5 is a waveform chart according to one embodiment of the present invention. The soft switching processing unit 140 may enable that the second duty cycle gradually decreases or increases with time by adjusting the second duty cycle. That is, both the modulated duty cycle and the duty cycle of the second pulse width modulation signal Vp2 may gradually change when switching phases, such that a phase current gradually changes when switching phases, thereby avoiding noise. As shown in FIG. 5, the waveform of the first signal V1 is gradually modulated to the waveform of the third signal V3 in a soft switching procedure. Each of the first signal V1 and the third signal V3 may be an M-shaped wave signal. The fourth signal V4 may be a triangular wave signal or sawtooth wave signal. Thus, when the motor controller 10 is in the soft switching driving mode, the motor controller 10 may achieve a current wave shaping function when switching phases and avoid generating an audio frequency signal. Moreover, the motor controller 10 may utilize the first duty cycle to operate in a speed closed-loop mode. The motor controller 10 may enable that the motor M achieves a target speed by capturing the first duty cycle. When the power supply voltage or the temperature varies, the speed of the motor M remains unchanged. The motor controller 10 may enable that the motor M rotates stably and the speed of the motor M does not drift.

According to one embodiment of the present invention, the motor controller 10 may be applied to a single-phase or polyphase configuration. By capturing the first duty cycle, the motor controller 10 may enter a soft switching driving mode and operate smoothly, thereby avoiding noise. Furthermore, the motor controller 10 may operate in a speed closed-loop mode by capturing the first duty cycle. When the power supply voltage or the temperature varies, the speed of the motor M remains unchanged. Therefore, the motor controller 10 of the present invention is capable of overcoming the problems encountered by the early method.

While the present invention has been described by the preferred embodiment, it is to be understood that the invention is not limited to the disclosed embodiment. On the contrary, it is intended to cover various modifications. Therefore, the scope of the appended claims should be accorded the broadest interpretation so as to encompass all such modifications.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A motor controller comprising:
   a switch circuit, coupled to a motor for driving the motor;
   a control unit, configured to generate a plurality of control signals to control the switch circuit;
   a duty cycle processing unit, wherein the duty cycle processing unit receives a first pulse width modulation signal, the first pulse width modulation signal has a first duty cycle, and the duty cycle processing unit is configured to judge if the first duty cycle is equal to 0% or 100%
   a pulse width modulation processing unit, wherein the duty cycle processing unit generates a first signal to the pulse width modulation processing unit, and the first signal has the first duty cycle; and
   a soft switching processing unit, configured to generate a second signal to the pulse width modulation processing unit, wherein the second signal has a second duty cycle, the pulse width modulation processing unit comprises a multiplication operation unit, a comparing unit and a triangular wave generating unit, the multiplication operation unit generates a third signal based on the first signal and the second signal, the third signal has a modulated duty cycle, the triangular wave generating unit generates a fourth signal to the comparing unit, and the comparing unit receives the third signal and the fourth signal, so as to compare the third signal with the fourth signal for generating a second pulse width modulation signal to the control unit.

2. The motor controller of claim 1, wherein the duty cycle processing unit comprises a duty cycle computing unit, and the duty cycle computing unit utilizes a charging procedure to judge if the first duty cycle is equal to 0% or 100%.

3. The motor controller of claim 1, wherein the duty cycle processing unit comprises a duty cycle computing unit, and the duty cycle computing unit utilizes a discharging procedure to judge if the first duty cycle is equal to 0% or 100%.

4. The motor controller of claim 1, wherein the duty cycle processing unit comprises a duty cycle computing unit, the duty cycle computing unit is configured to capture the first duty cycle, and the motor controller utilizes the first duty cycle to operate in a speed closed-loop mode.

5. The motor controller of claim 1, wherein the motor controller further comprises a pulse width modulation processing unit, and the pulse width modulation processing unit enables that the first duty cycle is multiplied by a second duty cycle for generating a modulated duty cycle.

6. The motor controller of claim 5, wherein the pulse width modulation processing unit generates a second pulse width modulation signal to the control unit by comparing the modulated duty cycle with a comparing value.

7. The motor controller of claim 5, wherein the second duty cycle gradually decreases with time.

8. The motor controller of claim 5, wherein the second duty cycle gradually increases with time.

9. The motor controller of claim 6, wherein the comparing value is represented by an N-bit value, N is a positive integer, and N is greater than 1.

10. The motor controller of claim 9, wherein N is equal to 8.

11. The motor controller of claim 1, wherein the duty cycle processing unit comprises a duty cycle computing unit, the duty cycle computing unit is configured to capture the first duty cycle, and the duty cycle computing unit is a part of a microcontroller.

12. The motor controller of claim 11, wherein the microcontroller is implemented in an integrated circuit chip.

13. The motor controller of claim 1, wherein the duty cycle processing unit comprises a duty cycle computing unit, the first pulse width modulation signal further has an ON time and an OFF time, and the duty cycle computing unit comprises:
an ON time computing unit, configured to receive the first pulse width modulation signal for computing the ON time;
an OFF time computing unit, configured to receive the first pulse width modulation signal for computing the OFF time; and
a memory unit, wherein the memory unit is coupled to the ON time computing unit for storing the ON time, and the memory unit is coupled to the OFF time computing unit for storing the OFF time.

14. The motor controller of claim 13, wherein the OFF time computing unit is configured to judge if the first duty cycle is equal to 0%, and the ON time computing unit is configured to judge if the first duty cycle is equal to 100%.

15. The motor controller of claim 1, wherein the duty cycle processing unit comprises a duty cycle computing unit, the first pulse width modulation signal further has an ON time and a period, and the duty cycle computing unit comprises:
an ON time computing unit, configured to receive the first pulse width modulation signal for computing the ON time;
a period computing unit, configured to receive the first pulse width modulation signal for computing the period; and
a memory unit, wherein the memory unit is coupled to the ON time computing unit for storing the ON time, and the memory unit is coupled to the period computing unit for storing the period.

16. The motor controller of claim 15, wherein the period computing unit is configured to judge if the first duty cycle is equal to 0%, and the ON time computing unit or the period computing unit is configured to judge if the first duty cycle is equal to 100%.

17. The motor controller of claim 1, wherein the duty cycle processing unit comprises a duty cycle computing unit, the first pulse width modulation signal further has an OFF time and a period, and the duty cycle computing unit comprises:
an OFF time computing unit, configured to receive the first pulse width modulation signal for computing the OFF time;
a period computing unit, configured to receive the first pulse width modulation signal for computing the period; and
a memory unit, wherein the memory unit is coupled to the OFF time computing unit for storing the OFF time, and the memory unit is coupled to the period computing unit for storing the period.

18. The motor controller of claim 17, wherein the OFF time computing unit or the period computing unit is configured to judge if the first duty cycle is equal to 0%, and the period computing unit is configured to judge if the first duty cycle is equal to 100%.

19. The motor controller of claim 1, wherein the duty cycle processing unit comprises a duty cycle computing unit, the duty cycle computing unit comprises a charging unit, and the charging unit is configured to judge if the first duty cycle is equal to 0% or 100%.

20. The motor controller of claim 19, wherein the charging unit charges a device based on the first pulse width modulation signal, the duty cycle computing unit judges if the first duty cycle is equal to 0% or 100% based on a parameter value of the device.

21. The motor controller of claim 1, wherein the duty cycle processing unit comprises a duty cycle computing unit, the duty cycle computing unit comprises a discharging unit, and the discharging unit is configured to judge if the first duty cycle is equal to 0% or 100%.

22. The motor controller of claim 21, wherein the discharging unit discharges a device based on the first pulse width modulation signal, the duty cycle computing unit judges if the first duty cycle is equal to 0% or 100% based on a parameter value of the device.

23. The motor controller of claim 1, wherein the duty cycle processing unit comprises a duty cycle computing unit, the duty cycle computing unit comprises a specific application computing unit, and the specific application computing unit is configured to judge if the first duty cycle is equal to 0% or 100%.

24. The motor controller of claim 1, wherein the first duty cycle is represented by an N-bit value, N is a positive integer, and N is greater than 1.

25. The motor controller of claim 24, wherein N is equal to 8.

26. The motor controller of claim 1, wherein the first signal is an M-shaped wave signal.

27. The motor controller of claim 1, wherein the second duty cycle gradually decreases with time.

28. The motor controller of claim 1, wherein the second duty cycle gradually increases with time.

29. The motor controller of claim 1, wherein the third signal is an M-shaped wave signal.

30. The motor controller of claim 1, wherein the fourth signal is a triangular wave signal or sawtooth wave signal.

31. The motor controller of claim 1, wherein the fourth signal is a signal having a fixed frequency.

32. The motor controller of claim 1, wherein the comparing unit is a digital comparator.

33. The motor controller of claim 1, wherein when the motor controller is in a soft switching driving mode, the motor controller achieves a current wave shaping function when switching phases.

34. The motor controller of claim 1, wherein the motor controller is applied to a fan motor system.

35. The motor controller of claim 1, wherein the motor controller is applied to a single-phase or polyphase configuration.

36. The motor controller of claim 1, wherein the motor controller enables that the motor achieves a target speed by capturing the first duty cycle.

37. The motor controller of claim 1, wherein when a power supply voltage varies, a speed of the motor remains unchanged.

38. The motor controller of claim 1, wherein when a temperature varies, a speed of the motor remains unchanged.

39. The motor controller of claim 1, wherein the motor controller enables that the motor rotates stably and a speed of the motor does not drift.

40. The motor controller of claim 1, wherein the duty cycle processing unit comprises a duty cycle computing unit, and when a time that the first pulse width modulation signal remains at a low level is greater than a first predetermined time, the duty cycle computing unit judges that the first duty cycle is equal to 0%.

41. The motor controller of claim 1, wherein the duty cycle processing unit comprises a duty cycle computing unit, and when a time that the first pulse width modulation signal remains at a high level is greater than a second predetermined time, the duty cycle computing unit judges that the first duty cycle is equal to 100%.

42. The motor controller of claim 1, wherein the duty cycle processing unit comprises a duty cycle computing unit, and when a time that the first pulse width modulation signal remains at a level is greater than a third predetermined time, the duty cycle computing unit judges that the first duty cycle is equal to 0% or 100%.

43. The motor controller of claim 42, wherein if the level is a low level, the first duty cycle is equal to 0%.

44. The motor controller of claim 42, wherein if the level is a high level, the first duty cycle is equal to 100%.

* * * * *